(12) United States Patent
Natsume

(10) Patent No.: US 12,099,244 B2
(45) Date of Patent: Sep. 24, 2024

(54) METHOD OF MANUFACTURING LIGHT RECEIVING MODULE

(71) Applicant: Sumitomo Electric Industries, Ltd., Osaka (JP)

(72) Inventor: Kazutoshi Natsume, Osaka (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 442 days.

(21) Appl. No.: 17/570,067

(22) Filed: Jan. 6, 2022

(65) Prior Publication Data

US 2022/0221664 A1   Jul. 14, 2022

(30) Foreign Application Priority Data

Jan. 13, 2021   (JP) .................................. 2021-003503

(51) Int. Cl.
| | | |
|---|---|---|
| *G02B 6/42* | (2006.01) | |
| *G02B 3/04* | (2006.01) | |
| *H01L 31/0232* | (2014.01) | |
| *G02B 19/00* | (2006.01) | |

(52) U.S. Cl.
CPC ............. *G02B 6/4219* (2013.01); *G02B 3/04* (2013.01); *G02B 6/4206* (2013.01); *H01L 31/02327* (2013.01); *G02B 19/0009* (2013.01)

(58) Field of Classification Search
CPC ...... G02B 6/4219; G02B 3/04; G02B 6/4206; G02B 19/0009; H01L 31/02327
See application file for complete search history.

(56) References Cited

U.S. PATENT DOCUMENTS 5,586,208 A * 12/1996 Nishiyama ........... G02B 6/4227
                                                                385/91
2003/0210866 A1* 11/2003 Kuhara ................ G02B 6/4246
                                                                385/92

FOREIGN PATENT DOCUMENTS

| EP | 0552792 A1 * | 7/1993 | ........... G02B 6/4206 |
|---|---|---|---|
| JP | H06021485 A | 1/1994 | |
| JP | 08-018077 A | 1/1996 | |
| JP | 2005-250117 A | 9/2005 | |

* cited by examiner

*Primary Examiner* — Syed I Gheyas
(74) *Attorney, Agent, or Firm* — Volpe Koenig

(57) ABSTRACT

A method of manufacturing a light receiving module according to an embodiment includes positioning a light receiving element, positioning a lens that causes light to converge on the light receiving element, and positioning an optical fiber such that an end surface of the optical fiber is located at a position spaced apart from the lens by a certain distance. The certain distance is a distance that is offset from a focal length of the lens.

6 Claims, 15 Drawing Sheets

METHOD OF MANUFACTURING LIGHT RECEIVING MODULE

CROSS REFERENCES TO RELATED APPLICATIONS

The present invention contains subject matter related to Japanese Patent Application No. 2021-003503 filed in the Japan Patent Office on Jan. 13, 2021, the entire contents of which are incorporated herein by reference.

BACKGROUND OF THE INVENTION

1. Field of the Invention

The present disclosure relates to a method of manufacturing a light receiving module.

2. Description of the Related Art

Japanese Unexamined Patent Application Publication No. 8-18077 describes an analog photodiode (PD) module and a method of manufacturing the analog PD module. The analog PD module includes a package, a photodiode mounted on the package with a submount interposed therebetween, a ball lens mounted on the submount with a cap interposed therebetween, and an optical fiber optically connected to the ball lens. The optical fiber is held by a ferrule, and the ferrule is held by a ferrule holder.

In the method of manufacturing the analog PD module, an alignment operation for determining the positions of the PD, which is fixed to the above-mentioned package, the ball lens, and the optical fiber is performed. First, in the alignment operation, the PD that is sealed with a metal cap, the ferrule holder, and the ferrule to which the optical fiber is attached, are attached to a YAG welder having a three-axis (X, Y, and Z axes) alignment mechanism. The three-axis alignment mechanism is capable of adjusting the positions of the PD, the ball lens, and the optical fiber.

A laser is disposed on the side of the optical fiber, the side being opposite to the side on which the ball lens is disposed. Light emitted by the laser is output to the PD through the optical fiber and the ball lens. The PD detects the light emitted by the laser and input thereto through the optical fiber and the ball lens. In this manufacturing method, in order to suppress distortion due to non-linearity of conversion of photocurrent in the PD, the position of the optical fiber is set in such a manner that an end surface of the optical fiber comes closer to the ball lens side from a position where light sensitivity becomes maximum.

For example, when a light condensing diameter is smaller than a light receiving area of the PD, an electric field is concentrated on a light receiving portion of the PD, and extraction of carriers in the PD may be suppressed. The suppression of carrier extraction refers to the case where carriers are not sufficiently removed from the PD even when the PD stops receiving light. When suppression of carrier extraction occurs, there is a concern about deterioration of frequency characteristics such as an increase in light loss with an increase in the frequency of light.

SUMMARY OF THE INVENTION

Accordingly, it is an object of the present disclosure to provide a method of manufacturing a light receiving module capable of reducing the probability that suppression of extraction of carriers will occur and improving frequency characteristics.

A method of manufacturing a light receiving module according to the present disclosure includes positioning a light receiving element, positioning a lens that causes light to converge on the light receiving element, and positioning an optical fiber such that an end surface of the optical fiber is located at a position spaced apart from the lens by a certain distance. The certain distance is a distance that is offset from a focal length of the lens.

DESCRIPTION OF THE PREFERRED EMBODIMENTS

Description of Embodiment of Present Invention

Figure 1:
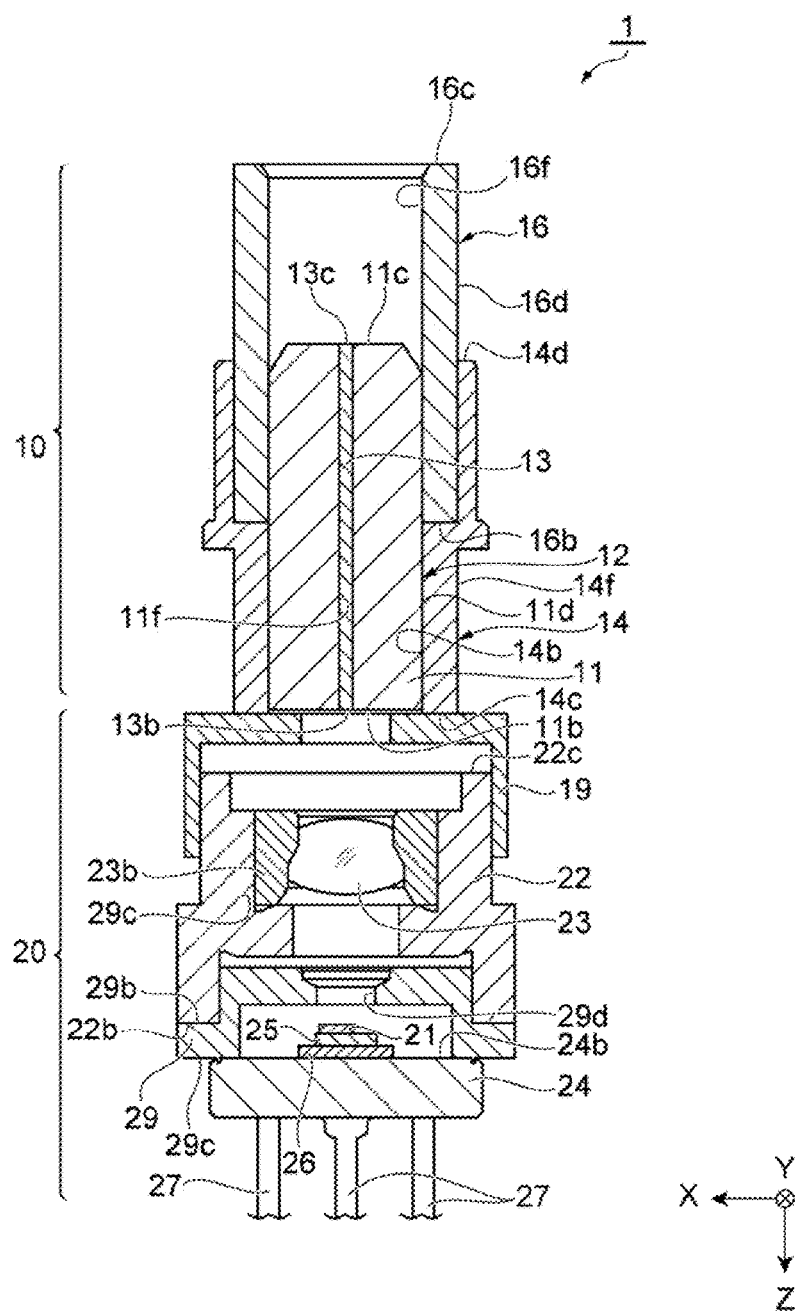
FIG. 1 is a sectional view illustrating a light receiving module according to an embodiment of the present disclosure.

First, the contents of an embodiment of the present disclosure will be listed and described. A method of manufacturing a light receiving module according to an embodiment of the present disclosure includes a step of positioning a light receiving element, a step of positioning a lens that causes light to converge on the light receiving element, and a step of positioning an optical fiber such that an end surface of the optical fiber is located at a position spaced apart from the lens by a certain distance. The certain distance is a distance that is offset from a focal length of the lens.

In the method of manufacturing the light receiving module, the light receiving element is positioned first, and then, the lens, which causes light to converge on the light receiving element, is positioned. The optical fiber is positioned such that the end surface thereof is located at the position spaced apart from the lens by the certain distance. The certain distance between the end surface of the optical fiber and the lens is a distance between a position that is offset from the focal position of the lens and the lens. The optical fiber is disposed at a position that is offset from the focus of the lens, so that concentration of an electric field onto the light receiving element can be suppressed, and thus, suppression of extraction of carriers in the light receiving element can be prevented from occurring. Therefore, the probability that suppression of extraction of carriers will occur is reduced, so that frequency characteristics can be improved.

The above-mentioned certain distance may be longer than the focal length. In this case, the optical fiber can be disposed at a position where the distance from the end surface of the optical fiber to the lens is longer than the focal length of the lens.

The above-mentioned certain distance may be shorter than the focal length. In this case, the optical fiber can be disposed at a position where the distance from the end surface of the optical fiber to the lens is shorter than the focal length of the lens.

The above-mentioned lens may be an aspherical lens. Even in the case where the lens is an aspherical lens, by disposing the optical fiber at a position that is offset from the focal position of the lens, the probability that suppression of extraction of carriers will occur can be reduced, so that the frequency characteristics can be improved.

The method of manufacturing the light receiving module further includes a step of setting the certain distance that is performed before the step of positioning the optical fiber. In the step of setting the certain distance, a distance by which a sensitivity of the light receiving element to light received by the light receiving element is equal to or higher than a certain percentage of a maximum sensitivity in the case where the optical fiber is disposed at a position spaced apart from the lens by the focal length may be set as the certain distance. In this case, the distance by which the sensitivity of the light receiving element to light received by the light receiving element is equal to or higher than the certain percentage of the maximum sensitivity is set as the certain distance. Thus, the certain distance can be set in such a manner that the sensitivity becomes close to the maximum sensitivity.

The step of setting the certain distance includes a step of inputting first light to the light receiving element and a step of inputting second light that has an intensity lower than that of the first light to the light receiving element. In the step of inputting the first light, a dip distance that is the distance from the lens to the optical fiber and by which the sensitivity of the light receiving element to light received by the light receiving element decreases is measured. In the step of inputting the second light, a distance that is the distance spaced apart from the dip distance and by which the sensitivity of the light receiving element to light received by the light receiving element is equal to or higher than the certain percentage of the maximum sensitivity may be set as the certain distance. In this case, the dip distance by which the sensitivity decreases when the first light having the intensity higher than that of the second light is input is measured. In this manner, the dip distance from the optical fiber to the lens by which the sensitivity decreases when the first light is input can be measured. In addition, a distance that is spaced apart from the dip distance and by which the sensitivity of the light receiving element to light received by the light receiving element is equal to or higher than the certain percentage of the maximum sensitivity when the second light is input is set as the certain distance. Thus, the certain distance can be set as a distance that is different from the dip distance and by which the sensitivity becomes close to the maximum sensitivity when the first light and the second light are used.

The lens is held by a lens holder, and the optical fiber is held by a tubular sleeve. The method of manufacturing the light receiving module may further include a step of positioning a joint sleeve that is joined to the lens holder and the sleeve, the step being performed after the step of positioning the lens. In this case, the lens holder holding the lens and the tubular sleeve holding the optical fiber can be joined to each other by the joint sleeve.

The light receiving diameter of the light receiving element may be larger than the light condensing diameter of the lens. Even in the case where the light receiving diameter of the light receiving element is larger than the light condensing diameter of the lens as mentioned above, by disposing the optical fiber at a position that is offset from the focal position of the lens, the probability that suppression of extraction of carriers will occur can be reduced, so that the frequency characteristics can be improved.

Details of Embodiment of Present Disclosure

A specific example of the method of manufacturing the light receiving module according to the present disclosure will be described below with reference to the drawings. Note that the present invention is not limited to the exemplary embodiment, which will be described below, and is to be determined by the claims, and it is intended that all the modifications within the scope of the claims and the equivalents thereof are included in the scope of the present invention. In the descriptions of the drawings, elements that are the same as each other or that correspond to each other are denoted by the same reference signs, and repeated descriptions will be suitably omitted. For ease of understanding, some portions in the drawings may be illustrated in a simplified manner or in an exaggerated manner, and the dimensional ratios and so forth are not limited to those illustrated in the drawings.

A light receiving module 1 according to the embodiment will be described with reference to FIG. 1. FIG. 1 is a sectional view illustrating the light receiving module 1 according to the embodiment. For example, the light receiving module 1 includes an optical receptacle 10 that is connected to an optical fiber and a light receiving unit 20 that is fixed to the optical receptacle 10. The optical receptacle 10 includes a fiber stub (stub ferrule) 12, a sleeve 14, and a connector sleeve 16. The fiber stub 12 includes a ferrule 11 and an optical fiber 13.

The ferrule 11 has a tubular shape (or a cylindrical shape). The central axis of the ferrule 11 extends in the Z-axis direction, and the cross section of the ferrule 11 that is perpendicular to the central axis of the ferrule 11 has a circular shape. The ferrule 11 has a first end surface 11b and a second end surface 11c that are arranged in the Z-axis direction. The second end surface 11c is a surface that is brought into physical contact with a ferrule of an optical connector that is connected to the optical receptacle 10, and the second end surface 11c is, for example, polished. The optical connector that is connected to the optical receptacle 10 is, for example, an SC connector. The first end surface 11b is a surface opposite the second end surface 11c. The first end surface 11b is slightly inclined (e.g., at about four degrees or about eight degrees) with respect to a plane perpendicular to the central axis of the ferrule 11. The ferrule 11 has an outer peripheral surface 11d, which is a cylindrical surface.

The ferrule 11 further has a fiber holding hole 11f. The fiber holding hole 11f extends in the Z-axis direction and is formed on the central axis of the ferrule 11. A cross section of the fiber holding hole 11f has a circular shape, and the inner diameter of the fiber holding hole 11f is slightly larger than the outer diameter of the optical fiber 13. An opening of the fiber holding hole 11f is included in the second end surface 11c, and the other opening of the fiber holding hole 11f is included in the first end surface 11b. The fiber holding hole 11f extends between the first end surface 11b and the second end surface 11c of the ferrule 11 in the Z-axis direction. The ferrule 11 is made of, for example, zirconia (ZrO$_2$). By making the ferrule 11 out of zirconia having high toughness and high Young's modulus, a physical contact can be appropriately performed at the second end surface 11c.

The optical fiber 13 is, for example, a single-mode fiber and is a bare fiber from which a resin coating has been removed. The optical fiber 13 is made of, for example, a quartz. The optical fiber 13 extends such that its longitudinal direction (optical axis direction) is the same as the Z-axis direction and has an end surface 13b and an end surface 13c. The optical fiber 13 is inserted into the fiber holding hole 11f. The end surface 13b is exposed through the opening of the fiber holding hole 11f, the opening being located on the side on which the first end surface 11b is present, and the end surface 13c is exposed through the other opening of the fiber holding hole 11f, the other opening being located on the side on which the second end surface 11c is present. The end surface 13c is brought into contact with an end surface of the optical fiber of the optical connector that is connected to the optical receptacle 10. The end surface 13b is optically coupled to a light receiving element 21 of the light receiving unit 20. The light receiving element 21 is a photodiode. The outer diameter of the optical fiber 13 is, for example, 125 µm.

The sleeve 14 has a through hole 14b extending in the Z-axis direction and holds the fiber stub 12 inside the through hole 14b. The sleeve 14 is made of, for example, a metal material such as a stainless steel. The sleeve 14 has a tubular shape extending in the Z-axis direction. The sleeve 14 has a proximal end surface 14c, a distal end surface 14d, and an outer peripheral surface 14f. The proximal end surface 14c and the distal end surface 14d are arranged in the Z-axis direction, and the through hole 14b extends between the proximal end surface 14c and the distal end surface 14d. The cross section of the through hole 14b that is perpendicular to the Z-axis direction has a circular shape. The proximal end surface 14c faces a connection sleeve 19 of the light receiving unit 20. The fiber stub 12 is press-fitted into the through hole 14b of the sleeve 14 along the Z-axis direction. The outer peripheral surface 11d of the ferrule 11 is in contact with the inner surface of the through hole 14b, and as a result, the fiber stub 12 is fixed to the sleeve 14.

The connector sleeve 16 is a tubular member that extends in the Z-axis direction and is made of, for example, a ceramic. For example, the connector sleeve 16 is made of the same material as the ferrule 11 (e.g., zirconia). The inner diameter of the connector sleeve 16 is approximately equal to the outer diameter of the fiber stub 12. The connector sleeve 16 has a proximal end 16b and a distal end 16c that are arranged in the Z-axis direction. The connector sleeve 16 has an outer peripheral surface 16d and an inner peripheral surface 16f. The fiber stub 12 is inserted in an opening of the connector sleeve 16, the opening being located on the side on which the proximal end 16b is present.

A portion of the connector sleeve 16 on the side on which the proximal end 16b is present is inserted in a gap formed between the outer peripheral surface 11d of the ferrule 11 and the sleeve 14. Thus, the inner peripheral surface 16f of the connector sleeve 16 is in contact with the outer peripheral surface 11d of the ferrule 11. The ferrule of the optical connector is inserted into the other opening of the connector sleeve 16, the other opening being located on the side on which the distal end 16c is present. The second end surface 11c of the ferrule 11 and the end surface of the ferrule of the optical connector come into contact with each other in the connector sleeve 16. As a result, the optical fiber 13 held by the ferrule 11 and the optical fiber held by the ferrule of the optical connector are optically coupled to each other with high coupling efficiency.

The light receiving unit 20 includes the light receiving element 21, a lens holder 22, a lens 23, a stem 24, and a plurality of lead pins 27.

The stem 24 is an insulating member having a flat circular plate-like shape and has a flat main surface 24b. The main surface 24b intersects the optical axis of the optical fiber connected to the optical receptacle 10 (i.e., the optical axis of the optical fiber 13). For example, the main surface 24b is perpendicular to the optical axis of the optical fiber connected to the optical receptacle 10 (the optical axis of the optical fiber 13). The stem 24 is made of, for example, a ceramic.

The lens holder 22 is a metal member having a substantially tubular shape. The central axis of the lens holder 22 extends along the optical axis of the optical fiber 13. A proximal end 22b of the lens holder 22 in the optical axis direction of the optical fiber 13 is fixed to the main surface 24b of the stem 24 with an annular metal fitting 29 interposed therebetween. The annular metal fitting 29 has a first end surface 29b and a second end surface 29c in the optical axis direction. The proximal end 22b of the lens holder 22 is fixed to the first end surface 29b of the metal fitting 29, and the main surface 24b of the stem 24 is fixed to the second end surface 29c of the metal fitting 29. The metal fitting 29 has a window hole 29d that allows the light from the lens 23 to pass therethrough.

A distal end 22c of the lens holder 22 in the optical axis direction of the optical fiber 13 faces the connection sleeve 19 in the Z-axis direction. The connection sleeve 19 has a tubular shape. For example, the connection sleeve 19 is fixed to the sleeve 14 and the lens holder 22 by YAG welding. The lens holder 22 is made of, for example, an iron-nickel alloy.

The light receiving element 21 is optically coupled to the end surface 13b of the optical fiber 13. The light receiving element 21 receives light from the optical fiber of the optical connector connected to the optical receptacle 10 and outputs a current signal having a magnitude corresponding to the intensity of the light. For example, the light receiving element 21 is mounted on a carrier 25 that mainly includes a dielectric (as an example, the carrier 25 is simply formed of a dielectric), and the carrier 25 is placed on an integrated circuit chip 26. In other words, the light receiving element 21 is mounted on the integrated circuit chip 26 with the carrier 25 interposed therebetween. As the light receiving element 21, various photodiodes such as a PIN photodiode and an avalanche photodiode (APD) can be used. For example, the carrier 25 is a flat plate member made of a ceramic or a quartz. The integrated circuit chip 26 is a semiconductor integrated circuit (IC) that receives a current signal from the light receiving element 21 and converts the current signal into a voltage signal.

The plurality of lead pins 27 are rod-shaped metal members each of which extends in a direction crossing the main surface 24b of the stem 24. The plurality of lead pins 27 are fixed to the stem 24 by extending through the stem 24. The plurality of lead pins 27 transmit and receive electrical signals and electrical power to and from the light receiving element 21 and the integrated circuit chip 26 that are arranged in a space defined by the stem 24 and the metal fitting 29. The lens 23 is held inside the lens holder 22 and fixed to the inner peripheral surface of the lens holder 22 with a resin 23b interposed therebetween. The lens 23 is, for example, an aspherical lens.

Figure 2:
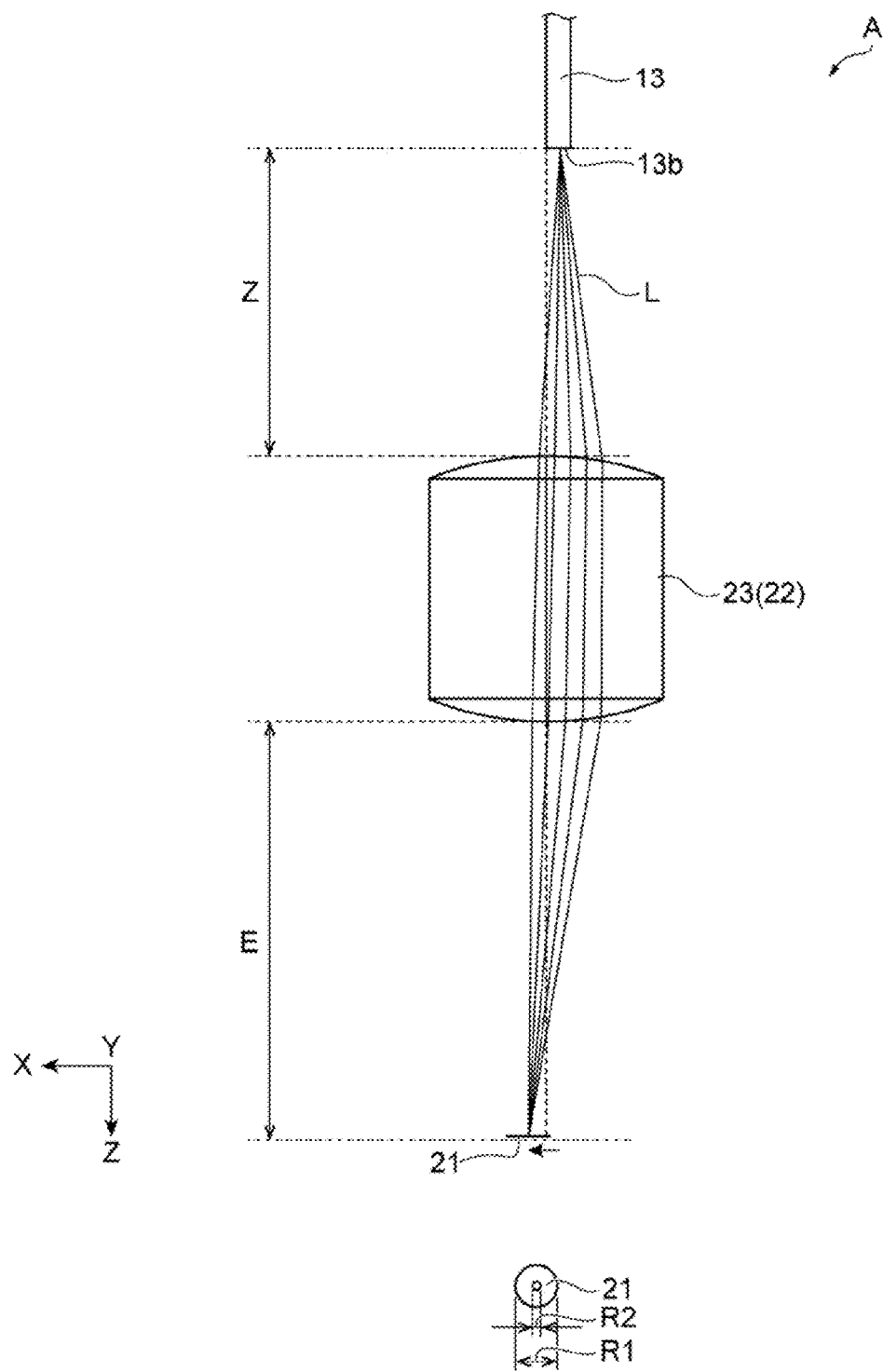
FIG. 2 is a diagram schematically illustrating a light receiving element, a lens, and an optical system of an optical fiber that are included in the light receiving module according to the embodiment.

FIG. 2 is a diagram illustrating an optical system A of the light receiving module 1. The lens 23 is a converging lens formed of a light transmitting member and is positioned on the optical axis of the optical fiber 13. The mode field diameter (MFD) of the end surface 13b of the optical fiber 13 is, for example, 8.0 μm or more and 9.2 μm or less. The lens 23 causes light L that is emitted from the end surface 13b of the optical fiber 13 to converge on the light receiving element 21.

The wavelength of the light L is, for example, 1,310 nm. In order to prevent the light reflected by the light receiving element 21 from being incident on the lens 23, for example, the optical axis of the lens 23 is slightly offset with respect to the optical axis of the optical fiber 13. In addition, in the X-axis direction, the center of a light receiving surface of the light receiving element 21 is positioned to be offset with respect to the center of the lens 23 by 100 μm. A light receiving diameter R1 of the light receiving element 21 for the light L is larger than a light condensing diameter R2 of the lens 23. As an example, the light receiving diameter R1 is 230 μm, and the light condensing diameter R2 is 50 μm or more and 60 μm or less. For example, the light receiving diameter R1 may be 10 times or more or 20 times or more the light condensing diameter R2.

Figure 3:
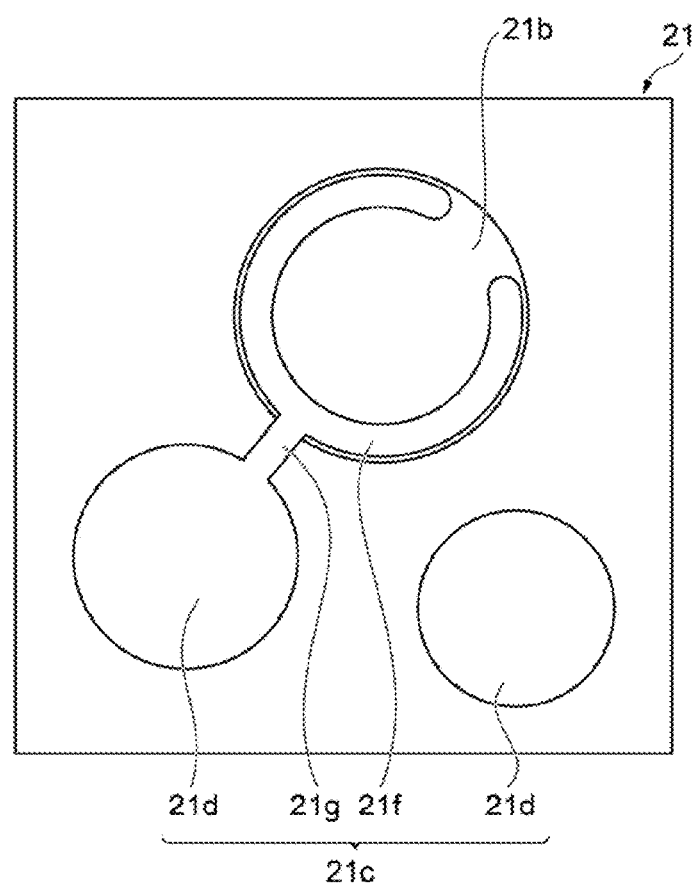
FIG. 3 is a diagram schematically illustrating the light receiving element of the light receiving module according to the embodiment.

FIG. 3 is a plan view schematically illustrating the light receiving element 21. As illustrated in FIG. 3, the shape of the light receiving element 21 when viewed in plan view (the shape of the light receiving element 21 when viewed in the Z-axis direction) is a rectangular shape. In the present embodiment, the light receiving element 21 is a test element group (TEG) chip. In other words, the light receiving element 21 is an evaluation chip. For example, the light receiving element 21 includes a light receiving portion 21b and an electrode 21c. As an example, the electrode 21c includes two pad electrodes 21d, an arc-shaped portion 21f that is disposed so as to surround the light receiving portion 21b, and a connecting portion 21g that connects one of the pad electrodes 21d and the arc-shaped portion 21f to each other.

Figure 4:
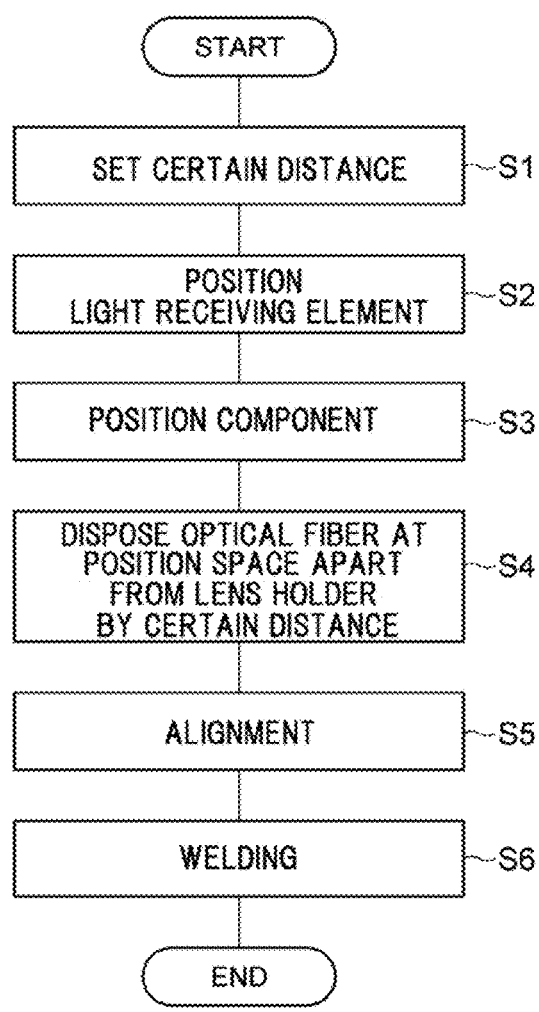
FIG. 4 is a flowchart illustrating steps of a method of manufacturing the light receiving module according to the embodiment.

A method of manufacturing the light receiving module 1 according to the embodiment will now be described with reference to FIG. 4. FIG. 4 is a flowchart illustrating steps of the method of manufacturing the light receiving module 1 according to the embodiment. The lens 23 is spaced apart from the end surface 13b of the optical fiber 13 by a certain distance. Before performing assembly of components and so forth, a step of setting the certain distance that is the distance between the lens 23 and the end surface 13b of the optical fiber 13 is performed first (step S1).

In step S1, for example, the certain distance is set in the optical system A including the optical fiber 13, the lens 23, and the light receiving element 21. The certain distance is the distance between a position that is offset from the focus of the lens 23 and the lens 23 and is, for example, longer than the focal length of the lens 23. In step S1, a step of inputting first light and a step of inputting second light having an intensity lower than that of the first light are performed. Each of these steps will be described later. As an example, the intensity of the first light is 10 mW, and the intensity of the second light is 1 mW. The wavelength of the first light and the wavelength of the second light are each, for example, 1,310 nm. In the step of inputting the first light and the step of inputting the second light, the first light and the second light are each input to the light receiving element 21 from the optical fiber 13 through the lens 23 in the optical system A.

Figure 5:
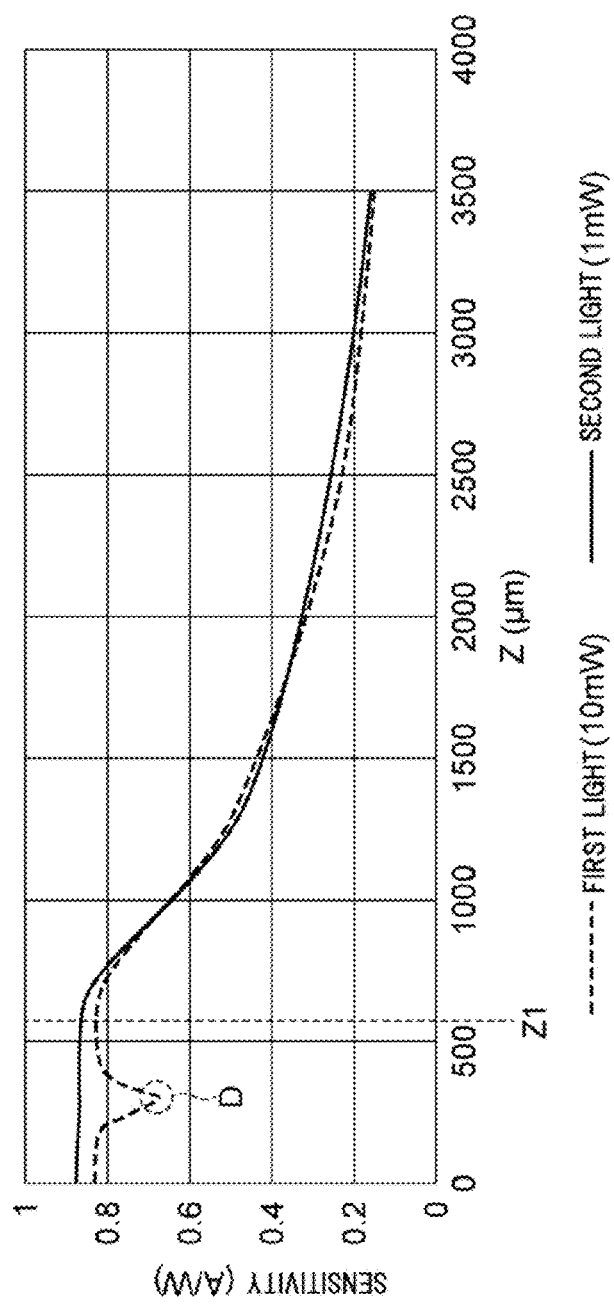
FIG. 5 is a graph illustrating an exemplary result obtained by inputting first light and an exemplary result obtained by inputting second light in a step of measuring the position of an end surface of the optical fiber.

An exemplary result obtained by performing the step of inputting the first light and an exemplary result obtained by performing the step of inputting the second light are illustrated in the graph in FIG. 5. In the graph illustrated in FIG. 5, the horizontal axis denotes a distance Z between the lens holder 22 and the end surface 13b of the optical fiber 13, and the vertical axis denotes the light sensitivity of the light receiving element 21. Note that the distance Z may be the distance from a surface of the lens 23 to the end surface 13b of the optical fiber 13 in the Z-axis direction. The sensitivity indicates an absolute sensitivity (in units of A/W) that is obtained by dividing the magnitude of a photocurrent (A) by the energy of input light (W).

As illustrated in FIG. 5, in the case of inputting the first light, a dip D where the light sensitivity decreases appears when the distance Z is a certain value. The dip D may appear as a result of strong light being concentrated and input to the light receiving element 21 to saturation and making it difficult for carriers and a current to flow. In the step of inputting the first light, a dip distance that is the distance Z from the lens holder 22 to the optical fiber 13 and by which the sensitivity decreases. For example, the dip distance is approximately the same as the focal length of the lens 23. It is understood that the dip distance in the case illustrated in FIG. 5 is about 300 μm.

In the case of inputting the second light having an intensity lower than that of the first light, although the dip D does not appear, the sensitivity gradually decreases when the distance Z becomes equal to or larger than a certain value. It is understood that, in the case illustrated in FIG. 5, the sensitivity gradually decreases when the distance Z becomes 600 μm or larger. In the step of inputting the second light, a distance that is a distance spaced apart from the dip distance and by which the sensitivity is equal to or higher than a certain percentage of a maximum sensitivity is set as the certain distance. In the case illustrated in FIG. 5, for example, the certain percentage is 99%, and 550 μm that is the distance Z corresponding to 99% or more of the maximum sensitivity when the second light is input is set as a certain distance Z1. Alternatively, the certain distance Z1 may be set to 500 µm or more and 600 µm or less.

As illustrated in FIG. 1 and FIG. 4, after the certain distance Z1 has been set, the light receiving element 21 is positioned (a step of positioning a light receiving element, step S2). More specifically, the integrated circuit chip 26 and the carrier 25 are mounted onto the main surface 24b of the stem 24, and the light receiving element 21 is mounted onto the carrier 25. After the light receiving element 21 has been positioned, a component of the light receiving module 1 is positioned (a step of positioning a lens, step S3). In this case, the metal fitting 29 is placed onto the main surface 24b of the stem 24, and the lens holder 22, which holds the lens 23, and the connection sleeve 19 are mounted onto the metal fitting 29 (a step of positioning a connection sleeve).

After the connection sleeve 19 has been mounted, the optical fiber 13 is positioned in such a manner that the end surface 13b is located at a position that is spaced apart from the lens holder 22 by the certain distance Z1 (a step of positioning an optical fiber, step S4). In the above-described case, the sleeve 14 is disposed at a position where the certain distance Z1 between the lens holder 22 and the end surface 13b of the optical fiber 13 is 550 µm. Then, alignment (XY alignment) of the optical fiber 13 in the X-axis direction and the Y-axis direction, each of which is perpendicular to the Z-axis direction, is performed (step S5). After the alignment of the optical fiber 13, the connection sleeve 19 is joined to the lens holder 22 by YAG welding, and the sleeve 14 is joined to the connection sleeve 19 by YAG welding (step S6). Then, the series of steps of the method of manufacturing the light receiving module 1 is completed.

Next, advantageous effects of the method of manufacturing the light receiving module 1 according to the present embodiment will be described. In the method of manufacturing the light receiving module 1, the lens 23 that causes light to converge on the light receiving element 21 is positioned after the light receiving element 21 has been positioned. The optical fiber 13 is positioned in such a manner that the end surface 13b is located at a position that is spaced apart from the lens 23 by the certain distance. The certain distance between the end surface 13b of the optical fiber 13 and the lens 23 is different from the focal length of the lens 23 and is offset from the focal length. By disposing the optical fiber 13 at a position that is offset from the focal length of the lens 23, concentration of an electric field onto the light receiving element 21 can be suppressed, and thus, suppression of extraction of carriers in the light receiving element 21 can be prevented from occurring. Therefore, the probability that suppression of extraction of carriers will occur is reduced, so that the frequency characteristics can be improved. In the present embodiment, in addition to improvement of the frequency characteristics by reducing the probability that suppression of extraction of carriers will occur, the sensitivity to input light in a wide wavelength band can be improved, and the linearity between input light power and the sensitivity can be improved. These advantageous effects will be described in detail later in the description of an example.

The above-mentioned certain distance is longer than the focal length. Thus, the optical fiber 13 can be disposed at a position where the distance from the end surface 13b of the optical fiber 13 to the lens 23 is longer than the focal length. Alternatively, the above-mentioned certain distance may be shorter than the focal length. In this case, the optical fiber 13 can be disposed at a position where the distance from the end surface 13b of the optical fiber 13 to the lens 23 is shorter than the focal length. However, the case of disposing the optical fiber 13 at a position where the distance from the end surface 13b of the optical fiber 13 to the lens 23 is longer than the focal length has an advantage in that YAG welding can more easily be performed.

The lens 23 is an aspherical lens. Even if the lens 23 is an aspherical lens, by disposing the optical fiber 13 at a position that is offset from the focal length of the lens 23, the probability that suppression of extraction of carriers will occur can be reduced, so that the frequency characteristics can be improved.

The method of manufacturing the light receiving module 1 according to the present embodiment includes the step of setting the certain distance that is performed before the step of positioning the optical fiber. In the step of setting the certain distance, a distance by which the sensitivity of the light receiving element 21 to light received by the light receiving element 21 is equal to or higher than a certain percentage (e.g., 99%) of the maximum sensitivity in the case where the optical fiber 13 is disposed at a position spaced apart from the lens 23 by the focal length is set as the certain distance. Accordingly, the distance by which the sensitivity of the light receiving element 21 to light received by the light receiving element 21 is equal to or higher than the certain percentage of the maximum sensitivity is set as the certain distance. Thus, the certain distance can be set in such a manner that the sensitivity becomes close to the maximum sensitivity.

As illustrated in FIG. 5, the step of setting the certain distance includes the step of inputting the first light to the light receiving element 21 and the step of inputting the second light that has an intensity lower than that of the first light to the light receiving element 21. In the step of inputting the first light, a dip distance that is the distance from the lens 23 to the optical fiber 13 and by which the sensitivity of the light receiving element 21 to light received by the light receiving element 21 decreases is measured. In the step of inputting the second light, a distance that is the distance spaced apart from the dip distance and by which the sensitivity of the light receiving element 21 to light received by the light receiving element 21 is equal to or higher than the certain percentage of the maximum sensitivity is set as the certain distance Z1. In other words, the dip distance by which the sensitivity decreases when the first light having the intensity higher than that of the second light is input is measured. In this manner, the dip distance from the optical fiber 13 to the lens 23 by which the sensitivity decreases when the first light is input can be measured. In addition, a distance that is spaced apart from the dip distance and by which the sensitivity of the light receiving element 21 to light received by the light receiving element 21 is equal to or higher than the certain percentage of the maximum sensitivity when the second light is input is set as the certain distance. Thus, the certain distance can be set as a distance that is different from the dip distance and by which the sensitivity becomes close to the maximum sensitivity when the first light and the second light are used.

The lens 23 is held by the lens holder 22, and the optical fiber 13 is held by the tubular sleeve 14. The method of manufacturing the light receiving module 1 according to the present embodiment further includes a step of positioning the connection sleeve 19, which is joined to the lens holder 22 and the sleeve 14, the step being performed after the step of positioning the lens. Therefore, the lens holder 22 holding the lens 23 and the tubular sleeve 14 holding the optical fiber 13 can be joined to each other by the connection sleeve 19.

The light receiving diameter R1 of the light receiving element 21 is larger than the light condensing diameter R2 of the lens 23. Even in the case where the light receiving diameter R1 of the light receiving element 21 is larger than the light condensing diameter R2 of the lens 23 as mentioned above, by disposing the optical fiber 13 at a position that is offset from the focal position of the lens 23, the probability that suppression of extraction of carriers will occur can be reduced, so that the frequency characteristics can be improved.

Example

An example of the method of manufacturing a light receiving module according to the present disclosure will be described below. Note that the present invention is not limited to the following example. In the example, various simulations relating to a light beam received by the light receiving element 21 were performed by using the optical system A of the light receiving module 1. First, as illustrated in FIG. 2, the position of the optical fiber 13 was determined in such a manner that the center of the light beam coincided with the center of the light receiving surface of the light receiving element 21 when the distance between the end surface 13b of the optical fiber 13 and the lens 23 was 300 µm. A distance E between the lens 23 and the light receiving element 21 was set to 2,160 µm. The wavelength of the light beam was set to 1,310 nm, and the MFD of the end surface 13b of the optical fiber 13 was set to 9.2 µm. The end surface 13b of the optical fiber 13 was inclined at four degrees with respect to a plane perpendicular to the central axis of the ferrule 11. An aspherical lens was used as the lens 23. The light receiving diameter R1 of the light receiving element 21 is 230 µm. In addition, in the X-axis direction, the center of the light receiving surface of the light receiving element 21 was positioned to be offset with respect to the center of the lens 23 by 100 µm.

Figure 6:
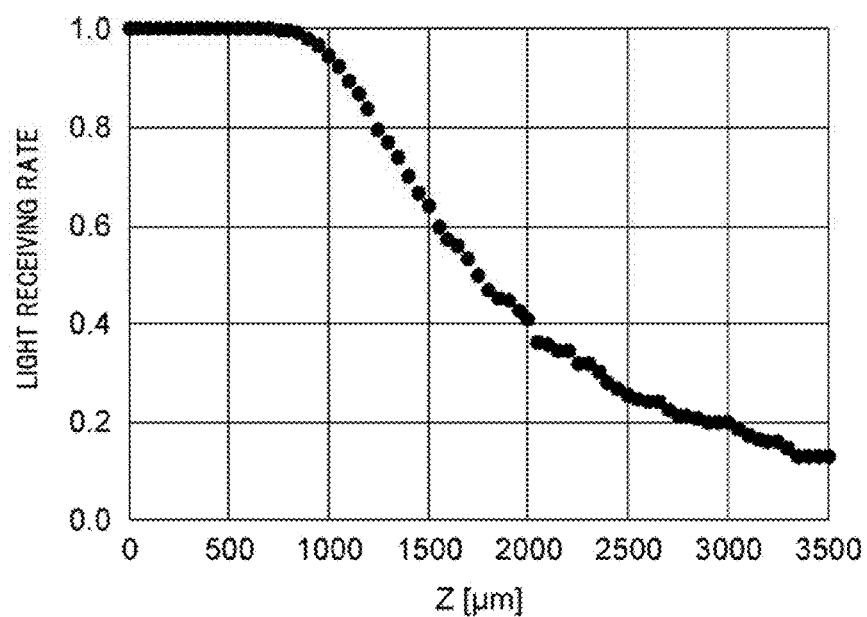
FIG. 6 is a graph illustrating a relationship between the distance from the end surface of the optical fiber to the lens and the light receiving rate of the light receiving element.

In the above-described optical system A, the relationship between the distance Z from the end surface 13b of the optical fiber 13 to the lens holder 22 and the light receiving rate of the light receiving element 21 was simulated. The simulation result is illustrated in FIG. 6. As illustrated in FIG. 6, it was found that, in the optical system A, the light receiving rate of the light receiving element 21 is about 1.0 when the distance Z is in the range of 0 µm or more to 800 µm or less, whereas the light receiving rate of the light receiving element 21 gradually decreases from 1.0 when the distance Z becomes 800 µm or more.

Figure 7:
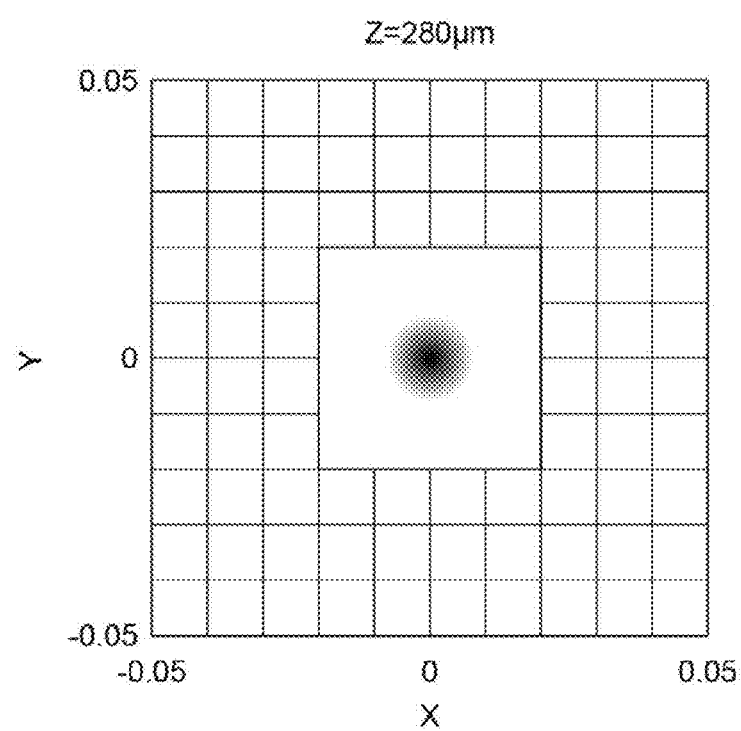
FIG. 7 illustrates a simulation result showing the state of light received by the light receiving element when the distance from the end surface of the optical fiber to the lens is a focal length (280 μm).
Figure 8:
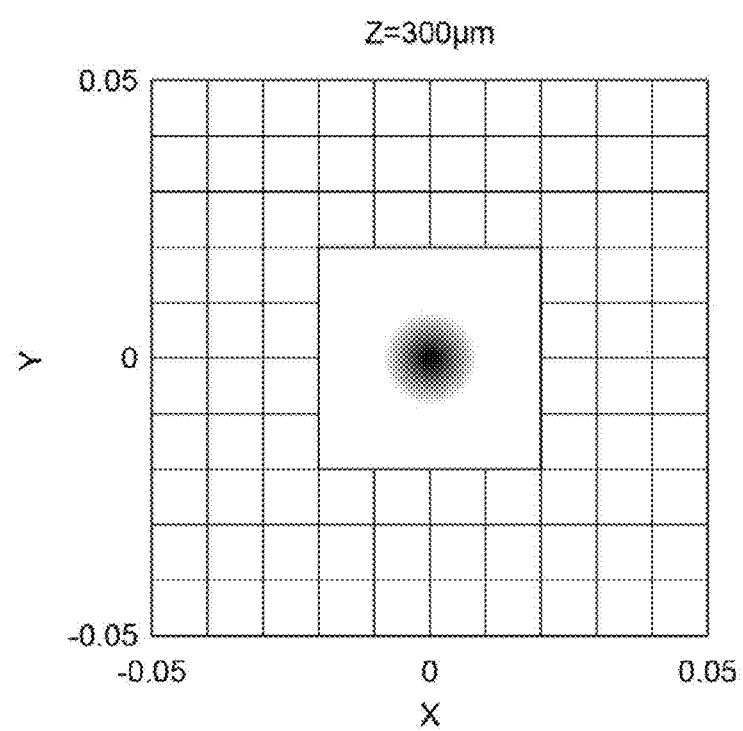
FIG. 8 illustrates a simulation result showing the state of light received by the light receiving element when the distance from the end surface of the optical fiber to the lens is 300 μm.
Figure 9:
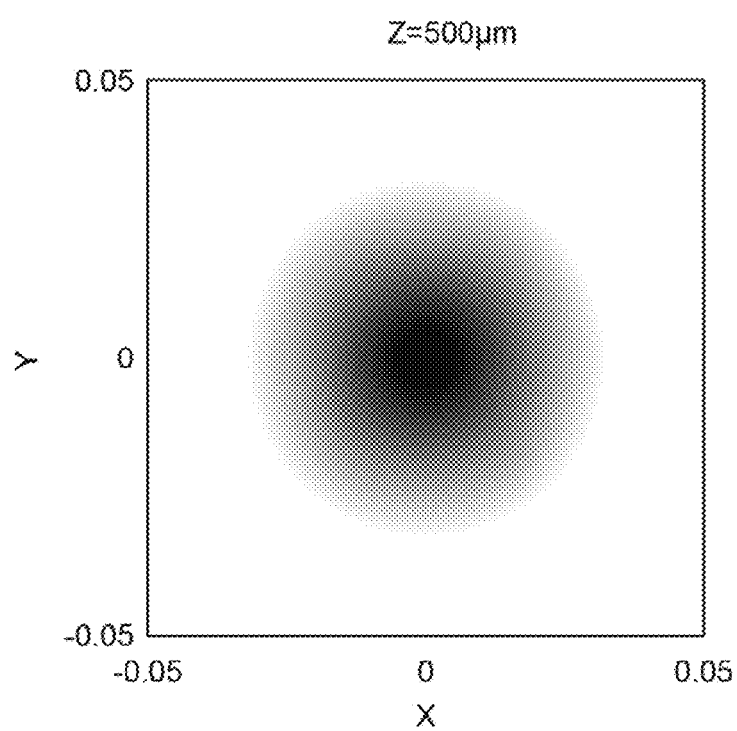
FIG. 9 illustrates a simulation result showing the state of light received by the light receiving element when the distance from the end surface of the optical fiber to the lens is 500 μm.

FIG. 7 illustrates the light beam received by the light receiving element 21 when the distance Z is 280 µm (the focal length). FIG. 8 illustrates the light beam received by the light receiving element 21 when the distance Z is 300 µm. FIG. 9 illustrates the light beam received by the light receiving element 21 when the distance Z is 500 µm. It is understood from FIG. 7 to FIG. 9 that the diameter of the light beam in the light receiving element 21 becomes larger as the distance Z increases from the focal length.

Figure 10:
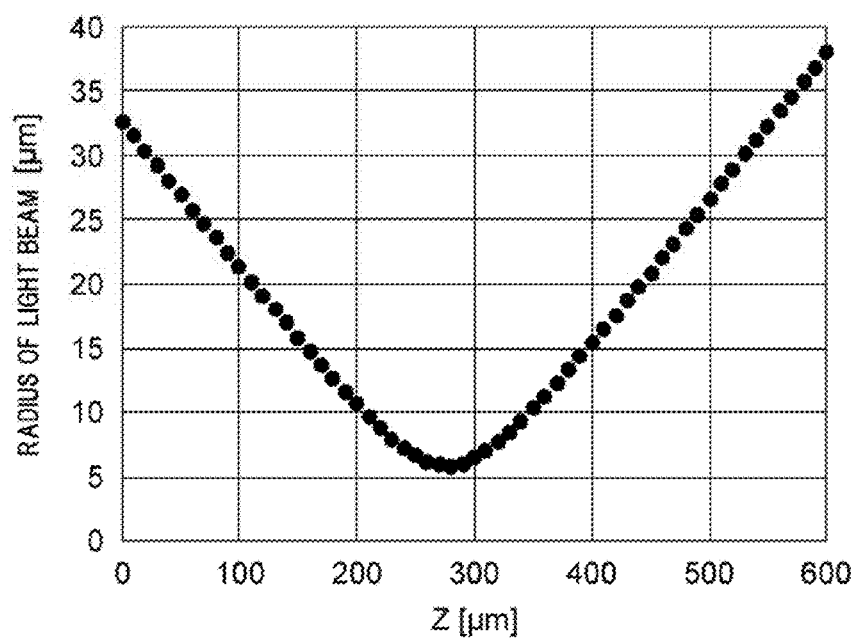
FIG. 10 is a graph illustrating a relationship between the distance from the end surface of the optical fiber to the lens and the radius of a light beam received by the light receiving element.

FIG. 10 is a graph illustrating the relationship between the distance Z and the radius of a light beam in the light receiving element 21. It is understood from FIG. 10 that the radius of the light beam becomes larger as the distance Z increases or decreases from 280 µm (the focal length). When the distance Z was 300 µm, the radius of the light beam in the light receiving element 21 was 6.5 µm, and when the distance Z was 500 µm, the radius of the light beam in the light receiving element 21 was 26.7 µm.

Figure 11:
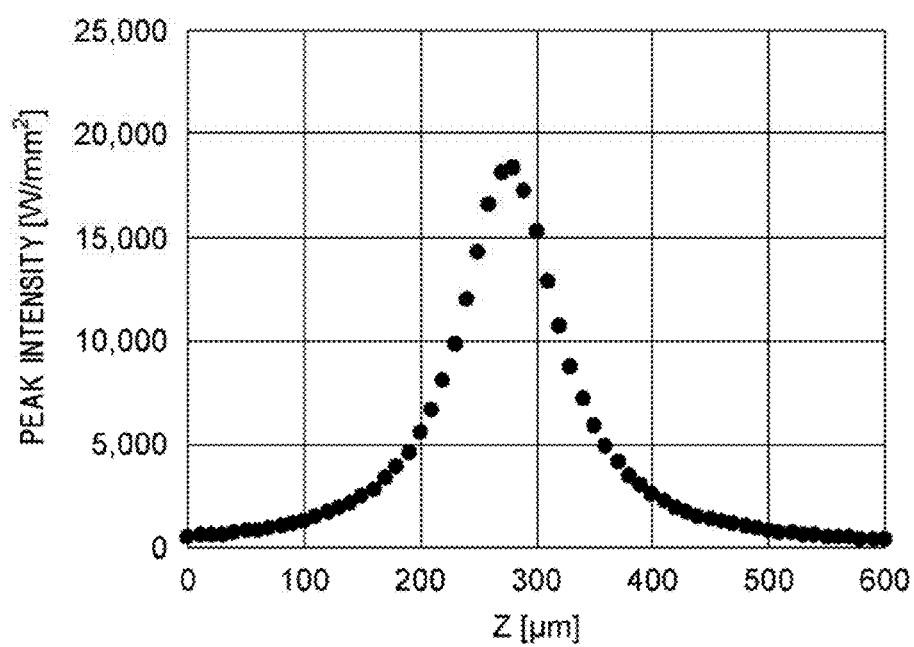
FIG. 11 is a graph illustrating a relationship between the distance from the end surface of the optical fiber to the lens and the peak intensity of a light beam received by the light receiving element.

FIG. 11 is a graph illustrating the relationship between the distance Z and the peak intensity of a light beam in the light receiving element 21. It is understood from FIG. 11 that the peak intensity of the light beam becomes lower as the distance Z increases or decreases from 280 µm (the focal length). When the distance Z was 280 µm, the peak intensity of the light beam was 18,300 W/mm$^2$, and when the distance Z was 300 µm, the peak intensity of the light beam was 15,300 W/mm$^2$. When the distance Z was 500 µm, the peak intensity of the light beam was 900 W/mm$^2$, and when the distance Z was 550 µm, the peak intensity of the light beam was 610 W/mm$^2$. In this manner, when the distance Z is 500 µm or more and 550 µm or less, the peak intensity can be significantly reduced compared with the case where the distance Z is 280 µm or more and 300 µm or less. As a result, it is presumed that the probability that suppression of extraction of carriers in the light receiving element 21 will occur can be reduced.

Figure 12:
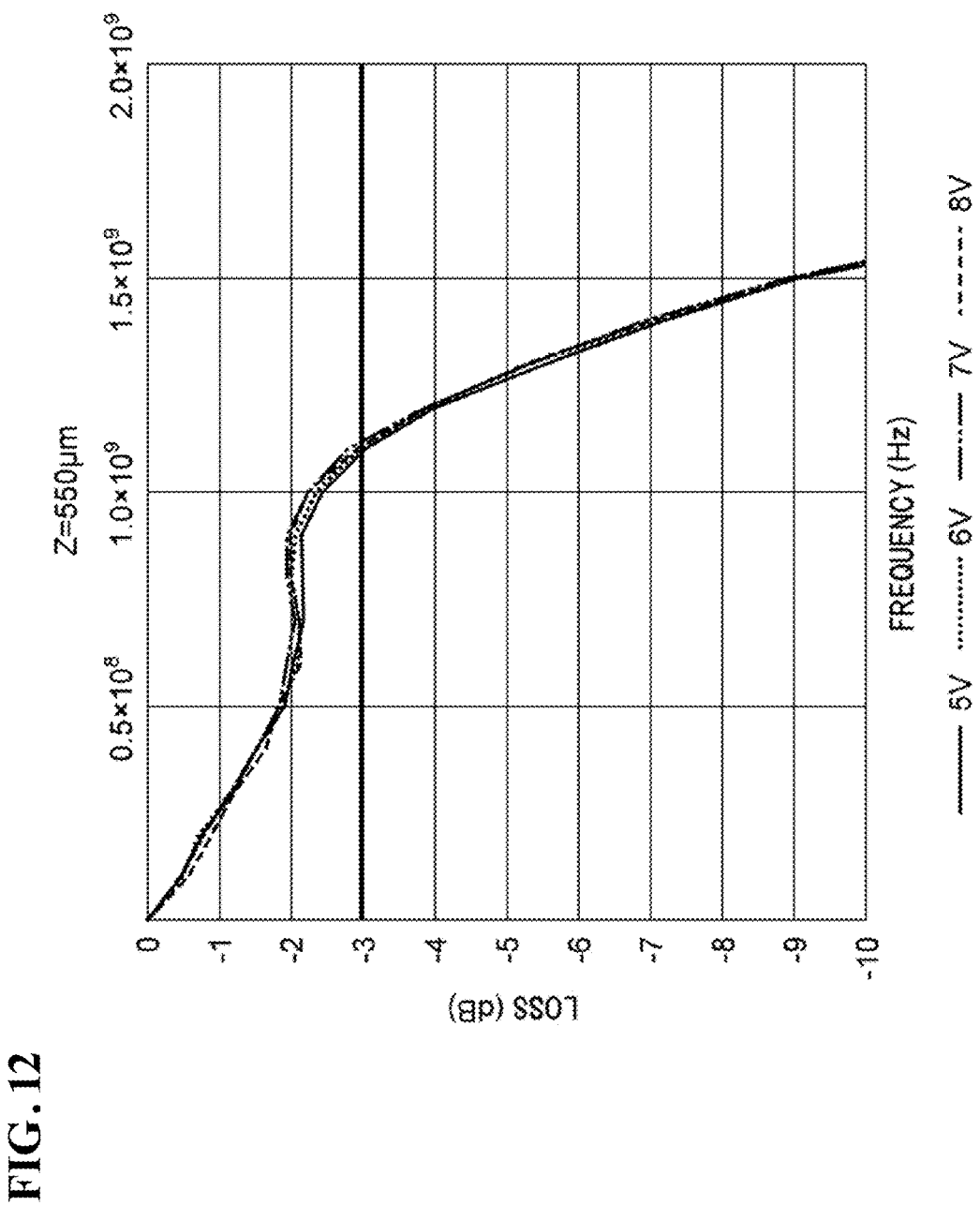
FIG. 12 is a graph illustrating a relationship between the frequency of light and light loss when the distance from the end surface of the optical fiber to the lens is 550 μm.
Figure 13:
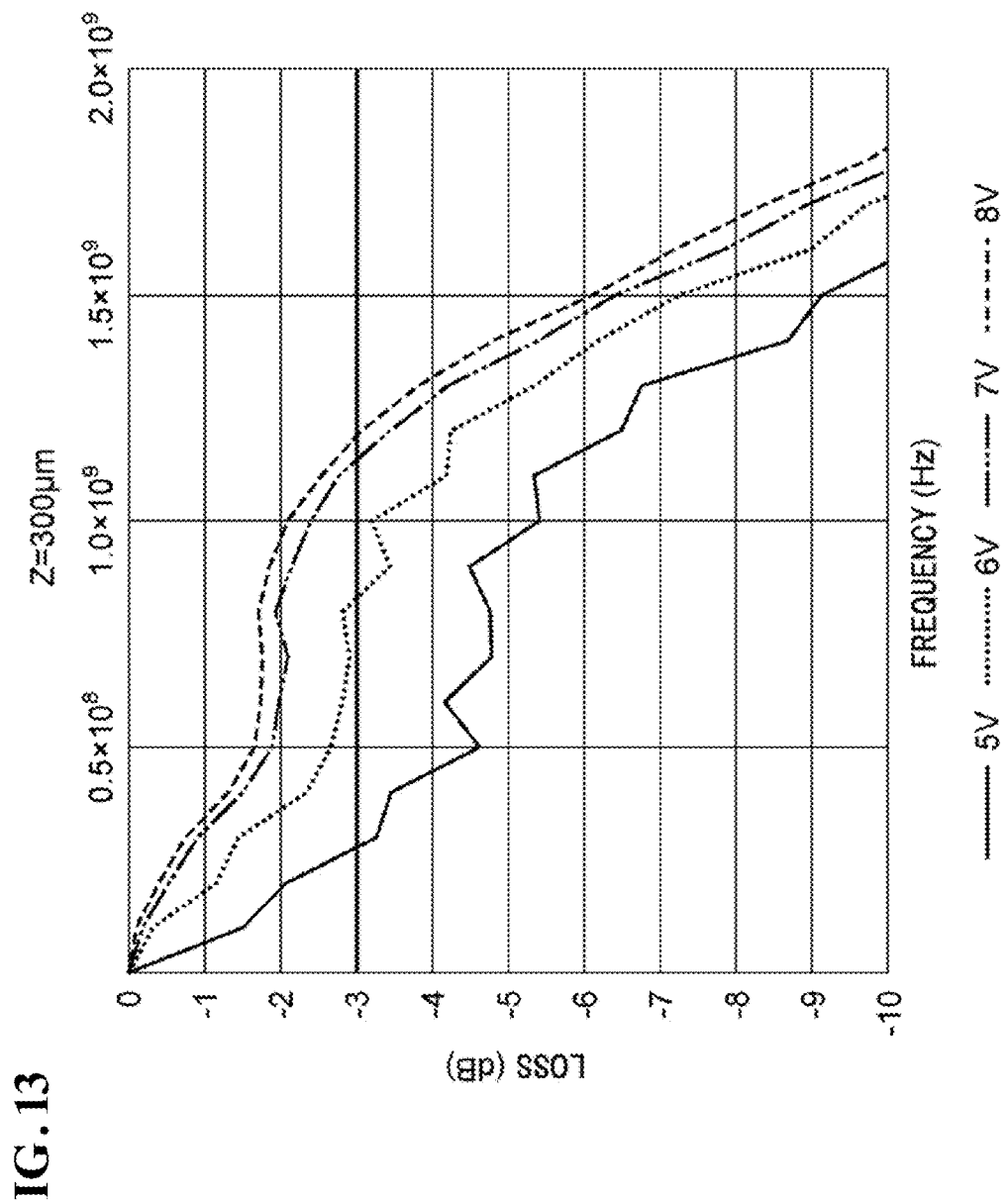
FIG. 13 is a graph illustrating a relationship between the frequency of light and light loss when the distance from the end surface of the optical fiber to the lens is 300 μm.

FIG. 12 is a graph illustrating the relationship between the frequency of light and light loss when the distance Z is 550 µm (a distance offset from the focal length). FIG. 13 is a graph illustrating the relationship between the frequency of light and light loss when the distance Z is 300 µm. FIG. 12 and FIG. 13 illustrate results of simulations of measurement of the frequency characteristics. In the simulations indicating the frequency characteristics, the input light power was set to 1.62 mW, and the wavelength of the input light was set to 1,310 nm.

As illustrated in FIG. 12 and FIG. 13, it was found that, in the case where the distance Z is 300 µm, which is close to the focal length, the loss generated with an increase in the frequency is larger than that in the case where the distance Z is 550 µm. In the case where the distance Z is 300 µm, it was found that the loss increases due to the dependence of reverse bias especially when the voltage is 5 V or 6 V. In contrast, in the case where the distance Z is 550 µm, it was found that the loss does not increase at a frequency of $1.0 \times 10^9$ Hz or lower even when the voltage is 5 V or 6 V and that the frequency characteristics are favorable.

Figure 14:
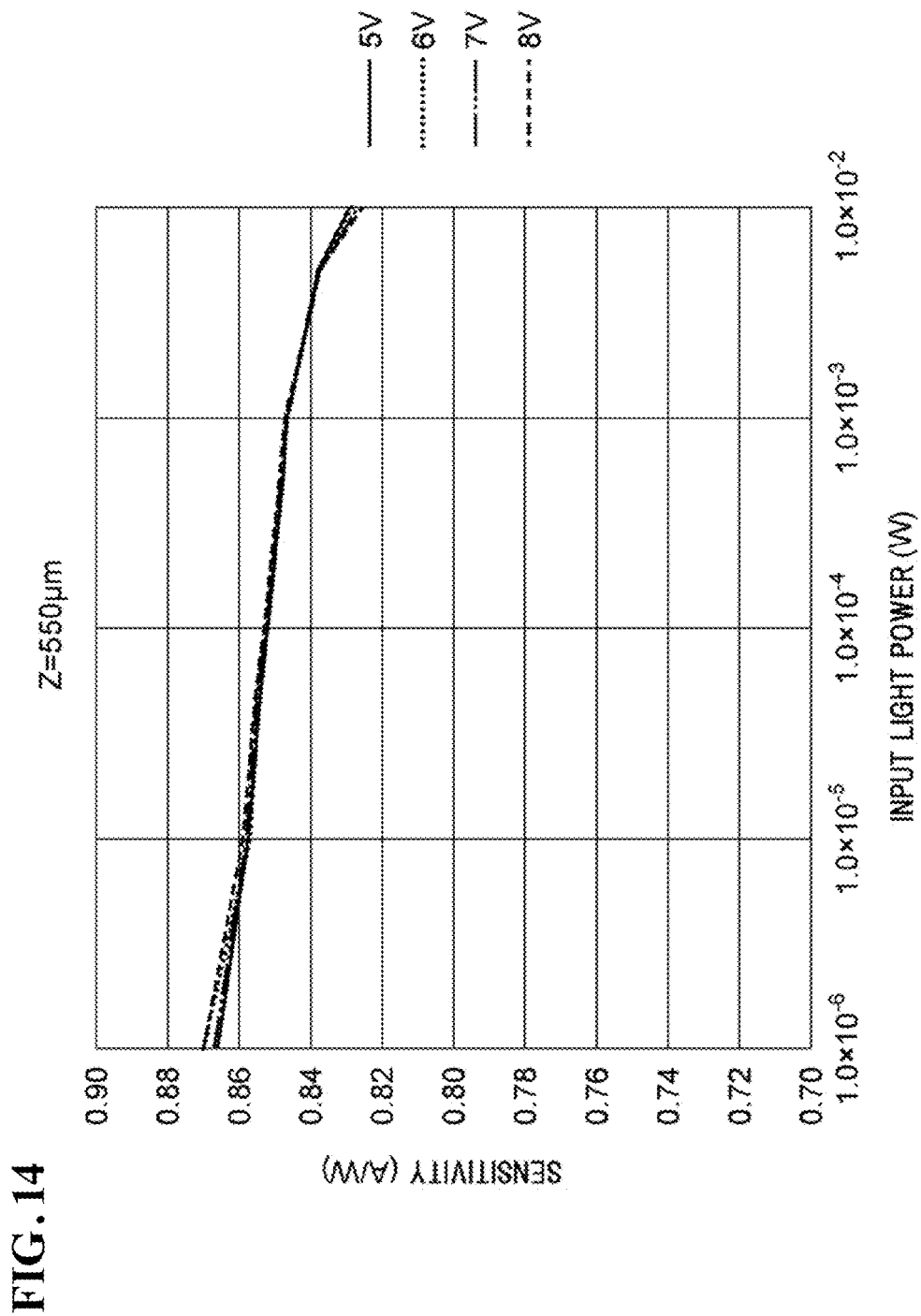
FIG. 14 is a graph illustrating a relationship between input light power and sensitivity when the distance from the end surface of the optical fiber to the lens is 550 μm.
Figure 15:
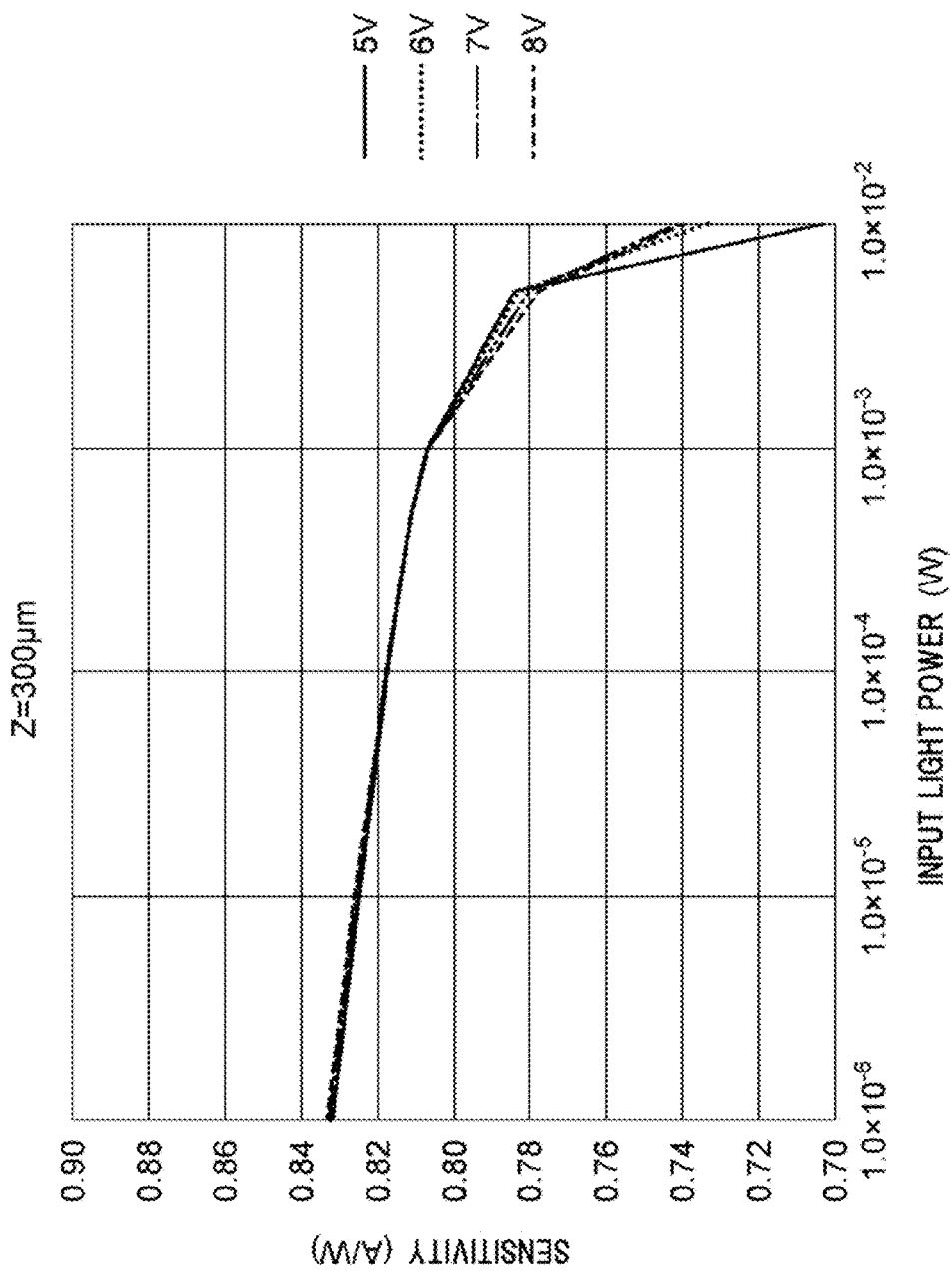
FIG. 15 is a graph illustrating a relationship between input light power and sensitivity when the distance from the end surface of the optical fiber to the lens is 300 μm.

FIG. 14 is a graph illustrating the relationship between input light power and sensitivity when the distance Z is 550 µm. FIG. 15 is a graph illustrating the relationship between input light power and sensitivity when the distance Z is 300 µm. FIG. 14 and FIG. 15 illustrate results of simulations of measurement of the linearity between the input light power and the sensitivity. As illustrated in FIG. 14 and FIG. 15, it was found that, in the case where the distance Z is 300 µm, which is close to the focal length, the sensitivity to the input light power is lower than that in the case where the distance Z is 550 µm. In the case where the distance Z is 300 µm, it was found that the sensitivity markedly decreases especially when the input light power exceeds $1.0 \times 10^{-3}$ W. In contrast, in the case where the distance Z is 550 µm, it was found that the sensitivity does not markedly decrease even when the input light power is strong and that the linearity between the input light power and the sensitivity is maintained.

The embodiment and the example of the method of manufacturing a light receiving module according to the present disclosure have been described above. However, the present invention is not limited to the above-described embodiment or example. In other words, it can be easily understood by those skilled in the art that various modifications and changes can be made within the scope of the present invention as described in the claims.

For example, in the above embodiment, the light receiving module 1 that includes the optical receptacle 10 to which an SC connector is connected has been described. However, the light receiving module may include an optical receptacle to which a connector other than an SC connector (e.g., an LC connector or the like) is connected. In the above embodiment, the light receiving module 1 that includes the lens 23 which is an aspherical lens has been described. However, the type of lens included in the light receiving module is not particularly limited, and the lens may be a spherical lens. In addition, in the above embodiment, the light receiving module 1 includes the connection sleeve 19 has been described. However, the light receiving module does not need to include the connection sleeve 19. In this manner, the configuration of each component of the light receiving module and the contents and the order of the steps of the method of manufacturing the light receiving module are not limited to the above-described embodiments and examples and can be suitably changed.

What is claimed is:

1. A method of manufacturing a light receiving module comprising:
    positioning a light receiving element;
    positioning a lens that causes light to converge on the light receiving element;
    positioning an optical fiber such that an end surface of the optical fiber is located at a position spaced apart from the lens by a certain distance; and
    setting the certain distance that is performed before the positioning the optical fiber,
    wherein the certain distance is a distance that is offset from a focal length of the lens,
    wherein, in setting the certain distance, a distance by which a sensitivity of the light receiving element to light received by the light receiving element is equal to or higher than a certain percentage of a maximum sensitivity when the optical fiber is disposed at a position spaced apart from the lens by the focal length is set as the certain distance,
    wherein setting the certain distance includes inputting first light to the light receiving element and inputting second light that has an intensity lower than an intensity of the first light to the light receiving element,
    wherein, in inputting the first light, a dip distance that is a distance from the lens to the optical fiber and by which the sensitivity of the light receiving element to light received by the light receiving element decreases is measured, and
    wherein, in inputting the second light, a distance that is the distance spaced apart from the dip distance and by which the sensitivity of the light receiving element to light received by the light receiving element is equal to or higher than a certain percentage of the maximum sensitivity is set as the certain distance.

2. The method according to claim 1, wherein the certain distance is longer than the focal length.

3. The method according to claim 1, wherein the certain distance is shorter than the focal length.

4. The method according to claim 1, wherein the lens is an aspherical lens.

5. The method according to claim 1, further comprising:
    positioning a joint sleeve that is joined to a lens holder and a tubular sleeve, the positioning the joint sleeve being performed after the positioning the lens,
    wherein the lens is held by the lens holder, and
    wherein the optical fiber is held by the tubular sleeve.

6. The method according to claim 1, wherein a light receiving diameter of the light receiving element is larger than a light condensing diameter of the lens.

* * * * *